United States Patent
Watanabe

(10) Patent No.: US 6,781,472 B2
(45) Date of Patent: Aug. 24, 2004

(54) PSEUDO-CUBIC FUNCTION GENERATOR CIRCUIT

(75) Inventor: Makoto Watanabe, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 10/235,698

(22) Filed: Sep. 5, 2002

(65) Prior Publication Data
US 2003/0048143 A1 Mar. 13, 2003

(30) Foreign Application Priority Data
Sep. 5, 2001 (JP) ........................................ 2001-268894

(51) Int. Cl.$^7$ ................................................ H03L 1/00
(52) U.S. Cl. .................. 331/176; 331/158; 331/116 R; 331/116 FE; 331/66; 310/315; 327/359; 327/563
(58) Field of Search ....................... 331/176, 66, 116 R, 331/116 FE, 158; 310/315; 327/563, 359

(56) References Cited

U.S. PATENT DOCUMENTS 5,041,799 A * 8/1991 Pirez ........................... 331/44
5,999,063 A 12/1999 Sakurai et al.

FOREIGN PATENT DOCUMENTS

JP 11-68463 3/1999

* cited by examiner

Primary Examiner—Arnold Kinkead
(74) Attorney, Agent, or Firm—Katten Muchin Zavis Rosenman

(57) ABSTRACT

A pseudo-cubic function generator circuit comprises a CMOS inverter which is applied with a detected voltage of a sensor and supplied with a power supply voltage, and a voltage divider circuit for dividing the power supply voltage, wherein an output terminal of the CMOS inverter is connected to a voltage division point of the voltage divider circuit to generate an output voltage from the voltage division point. The pseudo-cubic function generator circuit can directly generate a large voltage change in a simple circuit configuration with a reduced noise component, and facilitates a setting of each parameter for specifying a cubic function curve. The parameter is set, for example, by scaling substantial gate areas of a P-MOS FET and an N-MOS FET which constitutes the CMOS inverter.

6 Claims, 8 Drawing Sheets

PSEUDO-CUBIC FUNCTION GENERATOR CIRCUIT

BACKGROUND OF THE INVENTION

1. Field of the Invention

The present invention relates to a pseudo-cubic function generator circuit for generating an output voltage which approximates a cubic function in response to an input voltage.

2. Description of the Related Arts

Electronic apparatuses often use quartz crystal units as a reference for the time, frequency, and the like. A representative crystal unit employs a quartz crystal blank of AT-cut. While the crystal unit having an AT-cut crystal blank has a high stability in resonance frequency, the frequency varies over several tens of ppm (parts per million) at maximum, for example, in response to a change in temperature from −30° C. to +80° C. It is known that the AT-cut crystal unit responds to the ambient temperature by exhibiting a frequency change which is represented by a cubic function curve that has an inflection point substantially in the vicinity of room temperature.

Recent electronic apparatuses are required to be highly functional and accurate. With such requirements, a quartz crystal oscillator using a crystal unit is often required to oscillate highly stable frequencies. To meet such requirements, a voltage controlled crystal oscillator is applied, for example, with a control voltage, which changes as a cubic function of the temperature, to maintain a constant frequency.

For generating a control voltage which changes as a cubic function of the temperature, Japanese Patent Laid-Open Application No. 11-68463, (JP, 11068463, A), for example, discloses a temperature compensated crystal oscillator which comprises a first circuit for converting a signal indicative of a temperature detected by a temperature sensor to a square curve signal in a higher temperature range than a normal temperature; and a second circuit for converting the detected signal to a square curve signal in a lower temperature range than the normal temperature, and combines the signals from the first and second circuits to generate a signal which approximates a cubic function.

Another technique for generating a cubic function voltage may take advantage of square law characteristics in the input/output relationship of FET (field effect transistor) to square an output detected by a temperature sensor, and multiply the resulting signal by the output detected by the temperature sensor using a multiplier circuit to generate the cubic function voltage.

In General, however, the circuit configured as described above is highly susceptible to superimposition of a noise component on the resulting signal because the circuit largely amplifies a small voltage change. The foregoing circuit is also problematic in a complicated circuit configuration, a large number of elements used in the circuit, increased power consumption, and a higher cost.

SUMMARY OF THE INVENTION

It is an object of the present invention to provide a pseudo-cubic function generator circuit which is capable of directly generating a large voltage change in a simple circuit configuration, reducing a noise component and cost, and readily setting a parameter for controlling the shape of the cubic function curve.

The object of the present invention is achieved by a pseudo-cubic function generator circuit including a CMOS (complementary metal-oxide-semiconductor) inverter which is applied with a detected voltage of a sensor and supplied with a power supply voltage, and a voltage divider circuit for dividing the power supply voltage, wherein the CMOS inverter has an output terminal connected to a voltage division point of the voltage divider circuit to generate an output voltage from the voltage division point.

DETAILED DESCRIPTION OF THE INVENTION

Figure 1:
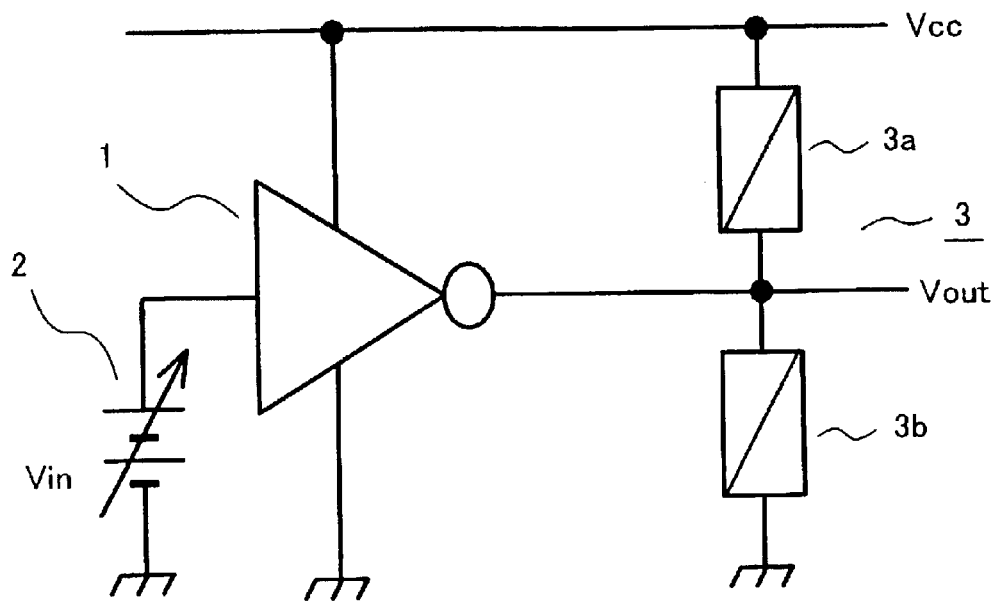
FIG. 1 is a circuit diagram illustrating the basic configuration of a pseudo-cubic function generator circuit according to the present invention.
Figure 1:
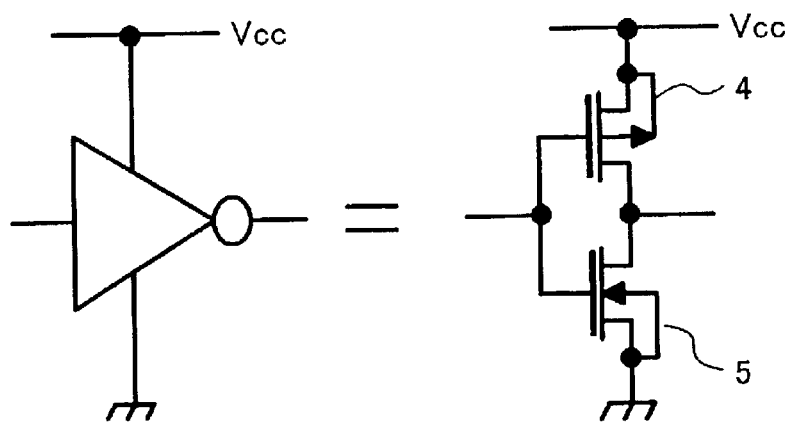

A pseudo-cubic function generator circuit illustrated in FIG. 1 comprises inverter 1 supplied with a voltage indicative of a value detected by sensor 2 as input voltage $V_{in}$; and voltage divider circuit 3 disposed on the output side of inverter 1. Typically, sensor 2 is a temperature sensor which delivers a voltage corresponding to a detected temperature.

Inverter 1 may be a CMOS (complementary metal-oxide-semiconductor) inverter which comprises P-channel MOS (P-MOS) FET (field effect transistor) 4, and N-channel MOS (N-MOS) FET 5. Here, the source of P-MOS FET 4 is connected to power supply $V_{cc}$, while the source of N-MOS FET 5 is grounded. The gates of MOS FETs 4, 5 are connected in common, and input voltage $V_{in}$ is applied to the commonly connected gates. The drains of MOS FETs 4, 5 are also connected in common and function as the output of inverter 1. Voltage divider circuit 3 has two resistors 3a, 3b, which have the same resistance and are connected in series, inserted between power supply $V_{cc}$ and a ground point. An output terminal of inverter 1 is connected to an interconnection of resistors 3a, 3b, and output voltage $V_{out}$ of the pseudo-cubic function generator circuit is fetched from this interconnection. When viewed from voltage divider circuit 3, the output of inverter 1 is connected to a voltage division point thereof.

Resistors $3a$, $3b$ of voltage divider circuit 3 are chosen to have a relatively low resistance so as to sufficiently utilize a non-linear region in which P-MOS FET 4 and N-MOS FET 5, forming constituting inverter 1, transition from a cut-off state to a conduction state.

Figure 2:
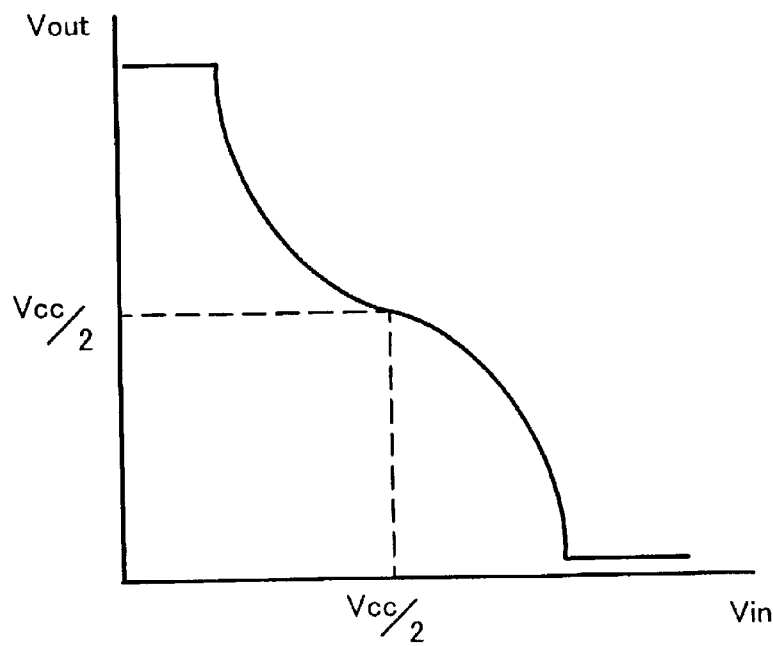
FIG. 2 is a graph showing the input/output characteristic of the circuit illustrated in FIG. 1.

With the use of the circuit configuration as described above, the circuit illustrated in FIG. 1 has the input/output characteristic as shown in FIG. 2. Specifically, N-MOS FET 5 connected to the ground turns off in a region in which input voltage $V_{in}$ of inverter 1 is lower than $V_{cc}/2$, and P-MOS FET 4 connected to the power supply $V_{cc}$ gradually conducts as the input voltage becomes lower, with the result that the output voltage initially increases gradually from $V_{cc}/2$, and then suddenly rises up. In a region in which $V_{in} < V_{cc}$ stands, a change in the output voltage to the input voltage can be substantially represented by a cubic function.

On the other hand, in a region in which input voltage $V_{in}$ of inverter 1 is higher than $V_{cc}/2$, P-MOS FET 4 connected to the power supply $V_{cc}$ turns off. As the input voltage is increased, N-MOS FET 5 connected to the ground gradually conducts, with the result that the output voltage initially decreases gradually from $V_{cc}/2$, and then suddenly falls down. In a region in which $V_{in} > V_{cc}$ stands, a change in the output voltage to the input voltage can be substantially represented by a cubic function.

Therefore, output voltage $V_{out}$ of the circuit illustrated in FIG. 1 generally exhibits a characteristic approximate to a cubic function curve which has a negative third-order coefficient, as shown in FIG. 2, to input signal $V_{in}$ which substantially linearly increases, for example, in response to the temperature. When this output voltage $V_{out}$ is applied, for example, to a control terminal of a voltage controlled crystal oscillator to control its oscillating frequency, the oscillating frequency can be compensated for the temperature and maintained constantly irrespective of a change in the ambient temperature.

While the temperature-to-frequency characteristic of a crystal unit having an AT-cut crystal unit is generally in the shape of cubic function curve, the temperature-to-frequency curve differs in shape from one crystal unit to another. Therefore, for accurately compensating a crystal oscillator for temperature, each crystal unit used therein needs a compensating voltage represented by a cubic function curve in a shape corresponding to its temperature characteristic.

In the circuit illustrated in FIG. 1, the curve representing the input/output characteristic is changed in shape by scaling the gate areas of P-MOS FET 4 and N-MOS FET 5 which constitutes inverter 1. Bearing this in mind, a pseudo-cubic function generator circuit illustrated in FIG. 3 has one or a plurality of P-MOS FETs $4a$ to $4n$ connected in parallel with P-MOS FET 4, when inverter 1 in the circuit illustrated in FIG. 1 is comprised of P-MOS FET 4 and N-MOS FET 5. These P-MOS FETs $4a$ to $4n$ are commonly applied with input voltage $V_{in}$ at their gates, and have their drains commonly connected to the drain of P-MOS FET 4. Also, P-MOS FETs $4a$ to $4n$ have their sources connected to power supply $V_{cc}$ through switches $6a$ to $6n$, respectively. As a result, by controlling on/off states of switches $6a$ to $6n$, it is possible to scale up and down the substantial gate area of the P-MOS FET which constitutes part of the inverter. Assuming that P-MOS FETs 4, $4a$ to $4n$ are formed in the same size, the gate area can be scaled by incrementally or decrementally adjusting the substantial gate width.

Figure 3:
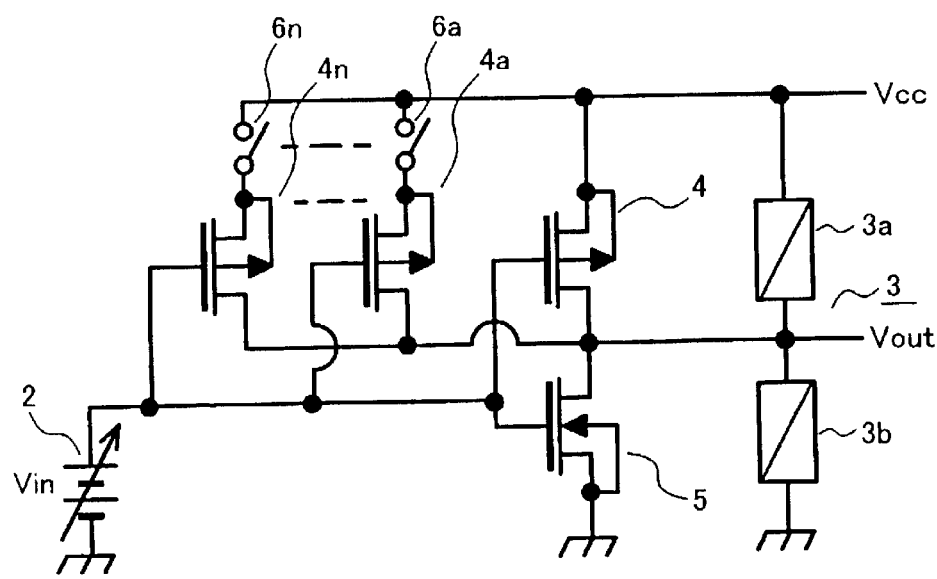
FIG. 3 is a circuit diagram illustrating the configuration which can effectively scale the gate area of a P-MOS FET which constitutes part of an inverter.
Figure 4:
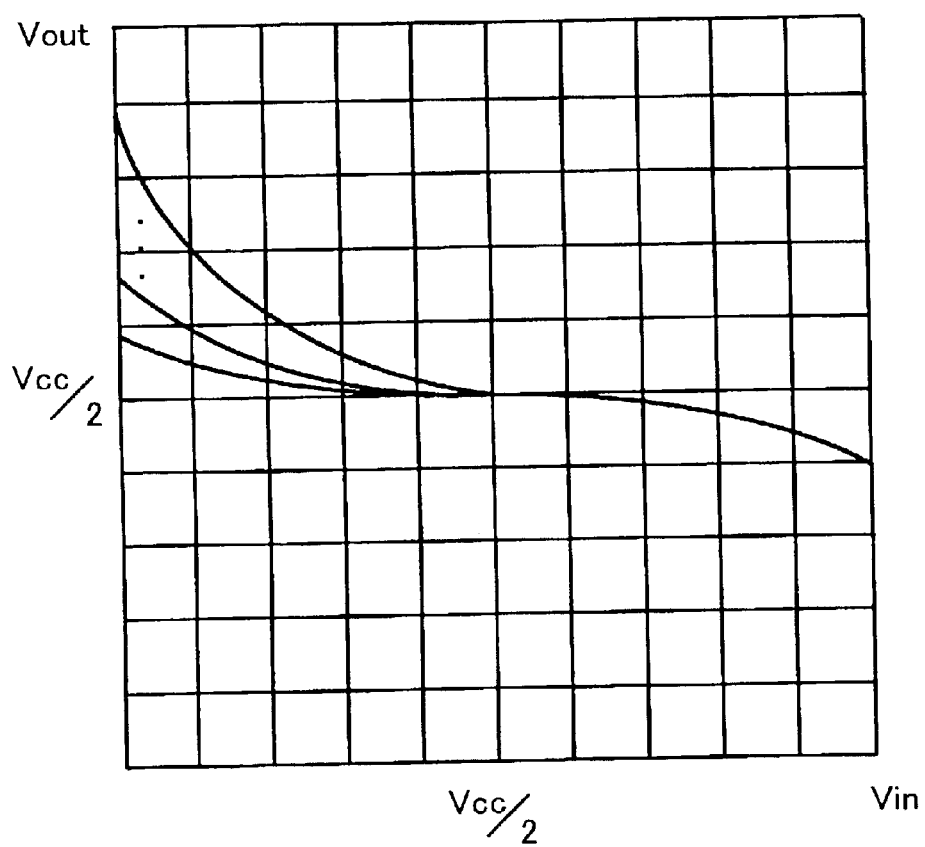
FIG. 4 is a graph showing the input/output characteristic of the circuit illustrated in FIG. 3.

As shown in FIG. 4, the circuit illustrated in FIG. 3 can exhibit an input/output characteristic curve which has a different shape in a region of the input voltage lower than $V_{cc}/2$ in accordance with a scaled substantial gate area of the P-MOS FET which constitutes part of the inverter. In this event, as a larger number of switches $6a$ to $6n$ are turned on to increase the substantial gate area of the P-MOS FET, the output voltage changes more abruptly to a change in the input voltage.

Figure 5:
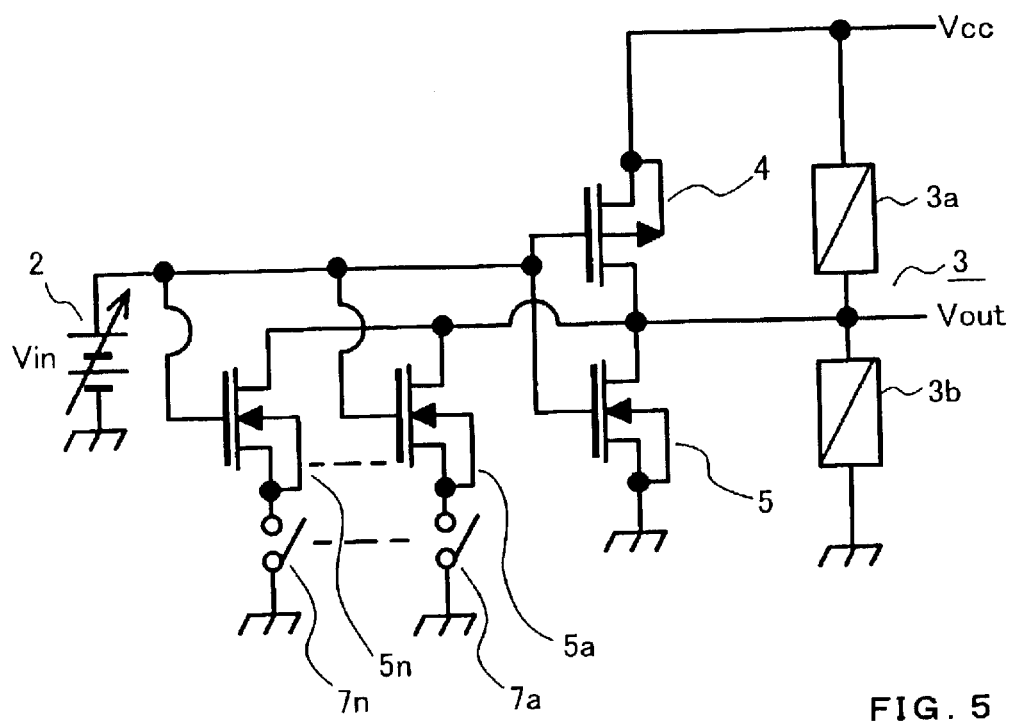
FIG. 5 is a circuit diagram illustrating the configuration which can effectively scale the gate area of an N-MOS FET which constitutes part of an inverter.

Likewise, a pseudo-cubic function generator circuit illustrated in FIG. 5 has one or a plurality of N-MOS FETs $5a$ to $5n$ connected in parallel with N-MOS FET 5. N-MOS FETs $5a$ to $5n$ are commonly applied with input voltage $V_{in}$ at their gates, and have their drains commonly connected to the drain of N-MOS FET 5. N-MOS FETs $5a$ to $5n$ also have their sources grounded through switches $7a$ to $7n$, respectively. This circuit is similar to that illustrated in FIG. 3 in that the substantial gate area of the N-MOS FET, which constitutes part of the inverter, can be scaled up and down by controlling on/off states of switches $7a$ to $7_n$. Assuming that N-MOS FETs 5, $5a$ to $5n$ are formed in the same size, the gate area can be scaled by incrementally or decrementally adjusting the substantial gate width.

Figure 6:
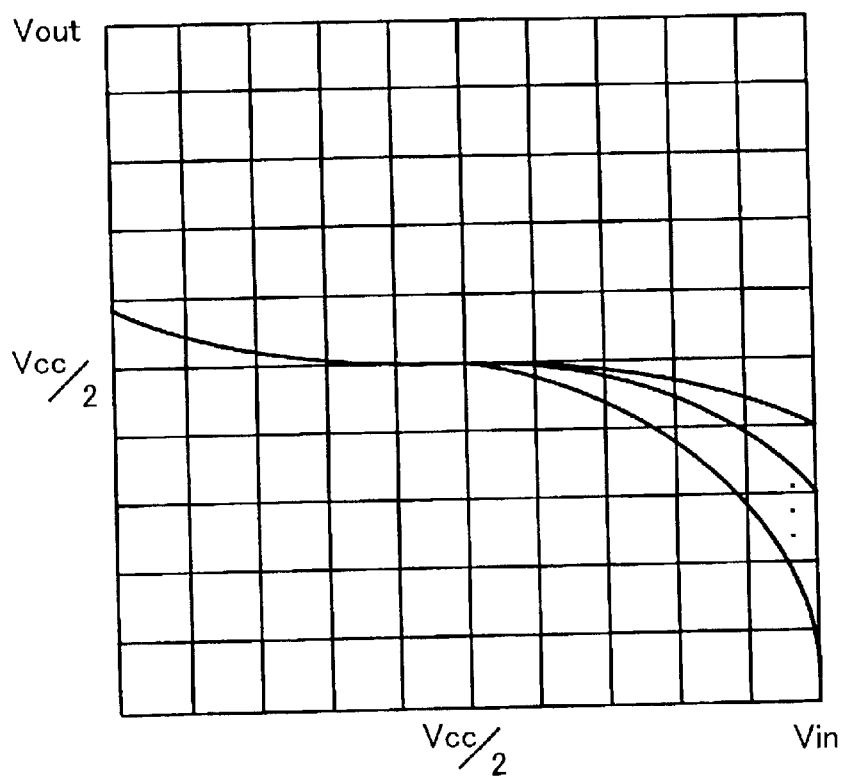
FIG. 6 is a graph showing the input/output characteristic of the circuit illustrated in FIG. 5.

As shown in FIG. 6, the circuit illustrated in FIG. 5 can exhibit an input/output characteristic curve which has a different shape in a region of the input voltage higher than $V_{cc}/2$ in accordance with a scaled substantial gate area of the N-MOS FET which constitutes part of the inverter. In this event, as a larger number of switches $6a$ to $6n$ are turned on to increase the substantial gate area of the N-MOS FET, the output voltage changes more abruptly to a change in the input voltage.

Figure 7:
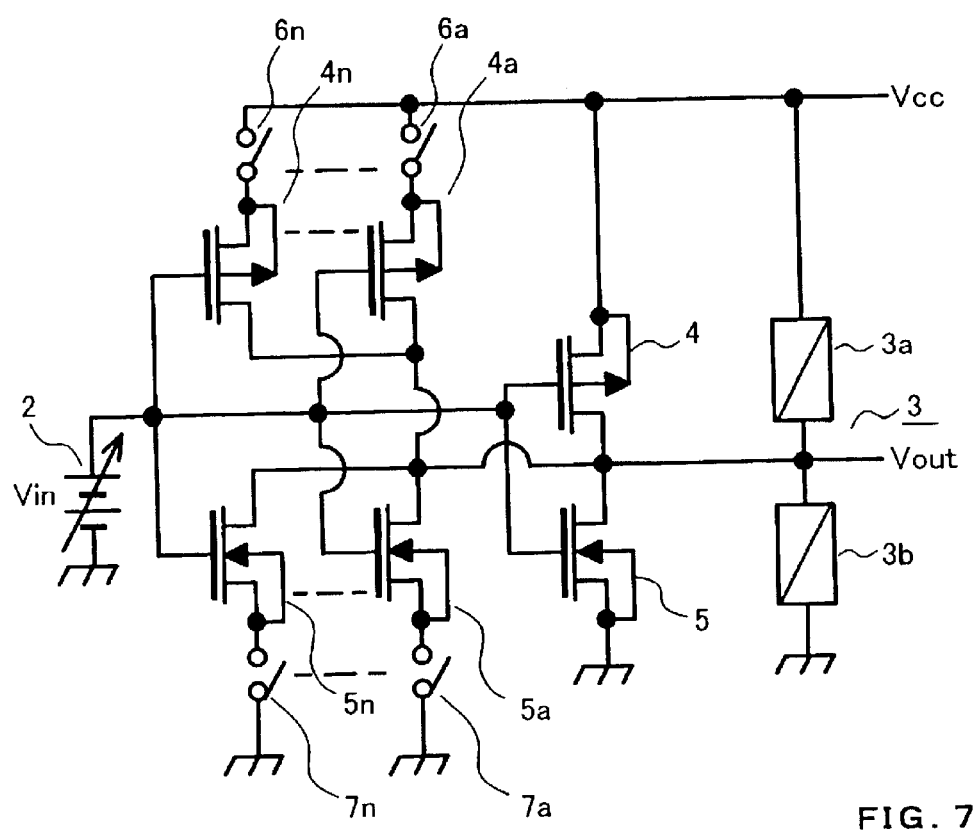
FIG. 7 is a circuit diagram illustrating a circuit which is a combination of the circuits illustrated in FIGS. 3 and 5.
Figure 8:
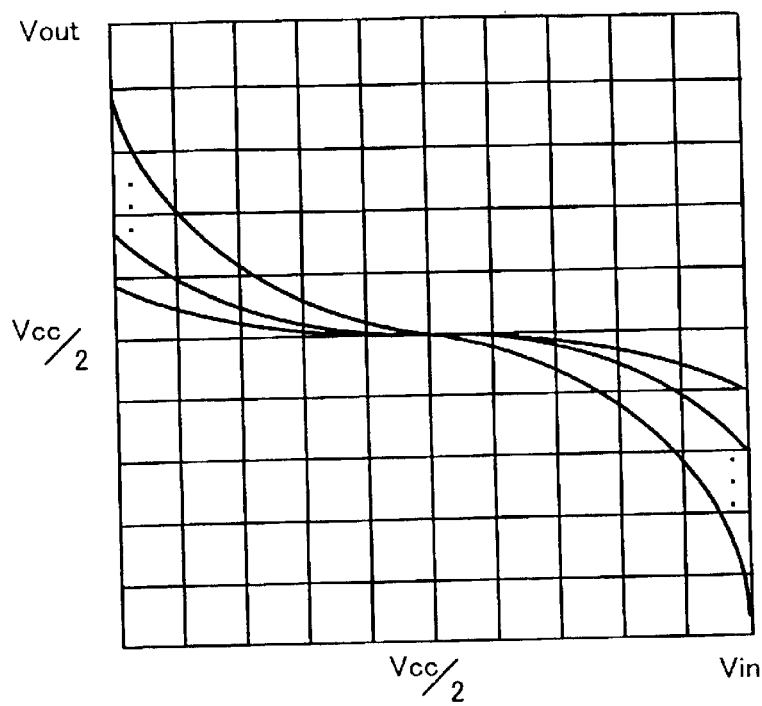
FIG. 8 is a graph showing the input/output characteristic of the circuit illustrated in FIG. 7.

As appreciated from the foregoing, the circuits illustrated in FIGS. 3 and 5, when used in combination to make up inverter 1 illustrated in FIG. 1, can produce cubic function curves which are different in shape from one another over the overall range of input voltage $V_{in}$. FIG. 7 illustrates a pseudo-cubic function generator circuit which is composed of the circuits illustrated in FIGS. 3 and 5 in combination. The substantial gate areas of the P-MOS FET and N-MOS FET, which constitute the inverter 1, can be changed by controlling on/off states of switches $6a$ to $6n$ and $7a$ to $7n$, respectively. Then, the output voltage of this pseudo-cubic function generator circuit changes as shown in FIG. 8 depending on the input voltage and substantial gate areas of the P-MOS FET and N-MOS FET.

Next, description will be made on a temperature compensated crystal oscillator which employs any of the foregoing pseudo-cubic function generator circuits.

Figure 9:
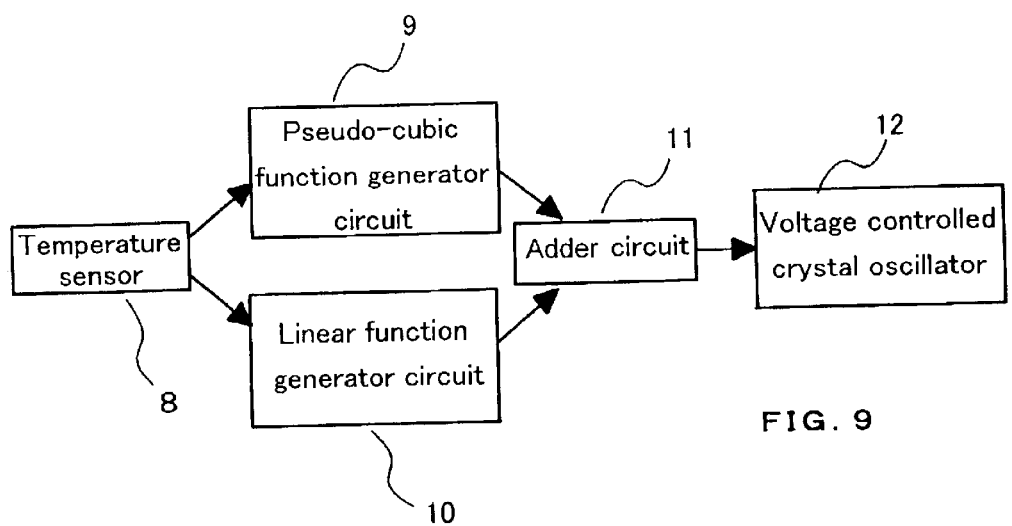
FIG. 9 is a block diagram illustrating the configuration of an exemplary temperature compensated crystal oscillator which applies the pseudo-cubic function generator circuit according to the present invention.

For compensating the oscillating frequency of the crystal oscillator for temperature using the foregoing pseudo-cubic function generators, they may be combined, for example, as illustrated in a block diagram of FIG. 9.

Temperature sensor 8 is provided for measuring the ambient temperature around a crystal unit to deliver a detected voltage which changes as a linear function corresponding to the measured temperature. The detected voltage is fed to both pseudo-cubic function generator circuit 9 and linear function generator circuit 10. Linear function generator circuit 10 generates an output voltage which is represented by a linear function in response to an input voltage, and is based, for example, on an operational amplifier, known to those skilled in the art. Pseudo-cubic function generator circuit 10 may be implemented, for example, in the configuration illustrated in FIG. 7.

Adder circuit 11 is provided for adding the output voltage of pseudo-cubic function generator circuit 9 and the output voltage of linear function generator circuit 10. The output of adder circuit 11 is supplied to voltage controlled crystal oscillator circuit 12 as a control voltage.

Figure 10:
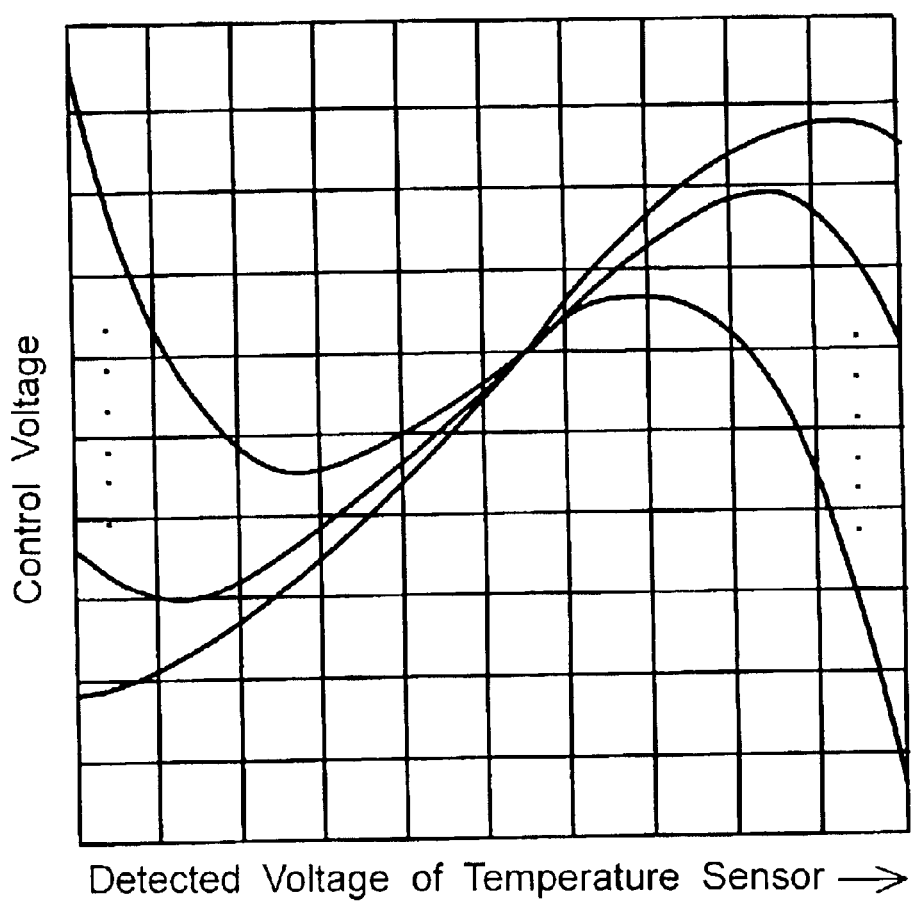
FIG. 10 is a graph showing the relationship between a detected voltage of a temperature sensor and a control voltage in the circuit illustrated in FIG. 9.

In this circuit, by adding a linear function to a pseudo-cubic function, adder circuit 11 can provide, at its output, temperature-to-voltage characteristic curves as shown in FIG. 10, wherein the cubic-function curves as shown in FIG. 8 are rotated, for example, to the counterclockwise direction around a point at which input voltage $V_{in}$ is $V_{cc}/2$. The angle of rotation in the combined outputs varies in accordance with an amplification ratio or an attenuation ratio in linear function generator circuit 10.

As appreciated, a pseudo-cubic function characteristic can be realized in an arbitrary shape, for example, as shown in FIG. 10, by changing the amplification ratio in linear function generator circuit 10 and the gate areas of the P-MOS FET and N-MOS FET in pseudo-cubic function generator circuit 9. The gate area of each MOS FET and the amplification ratio of linear function generator circuit 10 can be set such that the output voltage of adder circuit 11 changes corresponding to the temperature characteristic of, for example, an AT-cut crystal unit. Then, the output voltage is applied to voltage controlled crystal oscillator circuit 12 as a control voltage to correctly compensate the oscillating frequency of the crystal unit for temperature, thereby making it possible to maintain a constant oscillating frequency.

While the present invention has been described in connection with a preferred embodiment thereof; the foregoing description is intended only for purposes of illustrating the present invention, and various modifications and alterations can be made thereto without departing from the scope of the invention as defined in the appended claims.

What is claimed is:

1. A pseudo-cubic function generator circuit comprising:
    a CMOS inverter which is applied with a detected voltage of a sensor and supplied with a power supply voltage; and
    a voltage divider circuit for dividing the power supply voltage,
    wherein said CMOS inverter has an output terminal connected to a voltage division point of said voltage divider circuit to generate an output voltage from said voltage division point.
    wherein said power supply voltage has a positive polarity, and said pseudo-cubic function generator circuit generates a voltage in response to an input, said voltage approximating to a cubic function having a negative third-order coefficient, and wherein:
    said CMOS inverter includes a P-MOS FET and an N-MOS FET, and
    said pseudo-cubic function generator circuit controls an input/output characteristic thereof in a voltage region lower than a first voltage by scaling a gate area of said P-MOS FET, and controls the input/output characteristic in a voltage region higher than the first voltage by scaling a gate area of said N-MOS FET.

2. The pseudo-cubic function generator circuit according to claim 1, wherein:
    said voltage divider circuit includes a first and a second resistor each having a same resistance and connected in series to each other, and said voltage division point is located at an interconnection of said first and second resistors, and
    said first voltage is half as much as said power supply voltage.

3. The pseudo-cubic function generator circuit according to claim 1, further comprising means for substantially switching the gate area of said P-MOS FET.

4. The pseudo-cubic function generator circuit according to claim 1, further comprising means for substantially switching the gate area of said N-MOS FET.

5. The pseudo-cubic function generator circuit according to claim 1, further comprising:
    means for substantially switching the gate area of said P-MOS FET; and
    means for substantially switching the gate area of said N-MOS FET.

6. A temperature compensated crystal oscillator comprising:
    a pseudo-cubic function generator circuit comprising:
    a CMOS inverter which is applied with a detected voltage of a sensor and supplied with a power supply voltage; and
    a voltage divider circuit for dividing the power supply voltage.
    wherein said CMOS inverter has an output terminal connected to a voltage division point of said voltage divider circuit to generate an output voltage from said voltage division point, and
    wherein said sensor is a temperature sensor for generating a voltage corresponding to a temperature;
    a linear function generator circuit for generating an output voltage represented by a linear function to the detected voltage from said sensor;
    an adder circuit for adding an output of said pseudo-cubic function generator circuit and an output of said linear function generator circuit; and
    a voltage controlled crystal oscillator circuit applied with an output of said adder circuit as a control voltage,
wherein:
    said CMOS inverter includes a P-MOS FET and an N-MOS FET, and
    said pseudo-cubic function generator circuit controls an input/output characteristic thereof in a voltage region lower than a first voltage by scaling a gate area of said P-MOS FET, and controls the input/output characteristic in a voltage region higher than the first voltage by scaling a gate area of said N-MOS FET.

* * * * *